US012604720B2

(12) United States Patent
Nickerson et al.

(10) Patent No.: US 12,604,720 B2
(45) Date of Patent: Apr. 14, 2026

(54) THROUGH MOLD INTERCONNECT DRILL FEATURE

(71) Applicant: Intel Corporation, Santa Clara, CA (US)

(72) Inventors: Robert M. Nickerson, Chandler, AZ (US); Rees Winters, Glendale, AZ (US); Purushotham Kaushik Muthur Srinath, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 18/374,585

(22) Filed: Sep. 28, 2023

(65) Prior Publication Data

US 2024/0021500 A1    Jan. 18, 2024

Related U.S. Application Data

(63) Continuation of application No. 18/318,523, filed on May 16, 2023, which is a continuation of application No. 16/550,773, filed on Aug. 26, 2019, now Pat. No. 11,705,383.

(51) Int. Cl.
H01L 23/48 (2006.01)
H01L 23/31 (2006.01)
(52) U.S. Cl.
CPC .......... *H01L 23/481* (2013.01); *H01L 23/315* (2013.01)
(58) Field of Classification Search
None
See application file for complete search history.

(56) References Cited

U.S. PATENT DOCUMENTS

| | | | | |
|---|---|---|---|---|
| 8,222,538 B1* | 7/2012 | Yoshida | .............. | H05K 3/4007 |
| | | | | 174/262 |
| 2011/0140268 A1* | 6/2011 | Cheah | .................. | H05K 1/0298 |
| | | | | 257/737 |
| 2012/0211885 A1 | 8/2012 | Choi | | |
| 2012/0280404 A1* | 11/2012 | Kwon | ................... | H01L 21/565 |
| | | | | 257/E23.141 |
| 2014/0138826 A1 | 5/2014 | Kumar | | |
| 2014/0353821 A1 | 12/2014 | Yu | | |
| 2019/0006319 A1* | 1/2019 | Karhade | ............. | H01L 23/3135 |

OTHER PUBLICATIONS

Office Action from U.S. Appl. No. 18/318,523, mailed Jan. 31, 2024, 13 pgs.
Office Action from U.S. Appl. No. 18/318,523, mailed Jun. 12, 2024, 14 pgs.

(Continued)

*Primary Examiner* — Daniel Whalen
(74) *Attorney, Agent, or Firm* — Schwabe, Williamson & Wyatt, P.C.

(57) ABSTRACT

Embodiments disclosed herein include electronic packages. In an embodiment, an electronic package comprises a package substrate, a first die electrically coupled to the package substrate, and a mold layer over the package substrate and around the first die. In an embodiment, the electronic package further comprises a through mold opening through the mold layer, and a through mold interconnect (TMI) in the through mold opening, wherein a center of the TMI is offset from a center of the through mold opening.

20 Claims, 9 Drawing Sheets

(56)　　　　　　References Cited

OTHER PUBLICATIONS

Office Action from U.S. Appl. No. 18/318,523, mailed Sep. 19, 2024, 20 pgs.

Final Office Action from U.S. Appl. No. 18/318,523, mailed Feb. 11, 2025, 16 pgs.

Notice of Allowance from U.S. Appl. No. 18/318,523, mailed May 21, 2025, 9 pgs.

\* cited by examiner

THROUGH MOLD INTERCONNECT DRILL FEATURE

CROSS-REFERENCE TO RELATED APPLICATIONS

This application is a continuation of U.S. patent application Ser. No. 18/318,523, filed May 16, 2023, which is a continuation of U.S. patent application Ser. No. 16/550,773, filed on Aug. 26, 2019, now U.S. Pat. No. 11,705,383, issued Jul. 18, 2023, the entire contents of which are hereby incorporated by reference herein.

TECHNICAL FIELD

Embodiments of the present disclosure relate to semiconductor devices, and more particularly to vents for through mold interconnects (TMIs).

BACKGROUND

Advanced packaging architectures may include multichip packages. In some embodiments, package-on-package (PoP) architectures are used to couple a first package (e.g., a system-on-a-chip (SoC) package) to a second package (e.g., a memory package). The two packages are coupled together by through mold interconnects (TMIs). The TMIs include solder balls that are exposed by drilling a via through the mold layer. Typically, the via to ball spacing is constrained with the solder ball contacting the via walls. This is done to retain as much mold material as possible to provide mechanical integrity to the package, minimize warpage concerns, and prevent solder balls from shorting during the attach process. During attachment of the second package (and in subsequent reflow operations such as surface mount processes), outgassing of moisture absorbed by the package organic materials (particularly outgassing by a capillary underfill (CUF) material) in the first package exerts a high vapor pressure on the solder balls due to the constrained gap between the via sidewalls and the solder. This can potentially result in the solder being separated from the bottom pad. Such a phenomenon may be referred to in the art as "ball lifting". Ball lifting causes an electrical open and results in yield loss.

One solution to reduce the forces that cause ball lifting may include increasing the TMI drill diameter to provide a larger space for outgassing moisture. However, in architectures with tight spacing between the TMI and the die (e.g., approximately 500 μm or less), increases in the TMI drill diameter are not possible. Closer to the die, the CUF fillet extends close to the TMI, and a larger drill diameter would require ablating both the mold material and the CUF, which is not practical. Furthermore, at the package edges, a larger drill diameter risks the loss of mechanical integrity of the mold.

Other embodiments may include providing outgassing paths down through the package substrate of the first package. This is suboptimal because it requires forming openings through the various metal layers of the package substrate. Accordingly, electrical performance is sacrificed in order to reduce ball lifting during assembly.

EMBODIMENTS OF THE PRESENT DISCLOSURE

Figure 1:
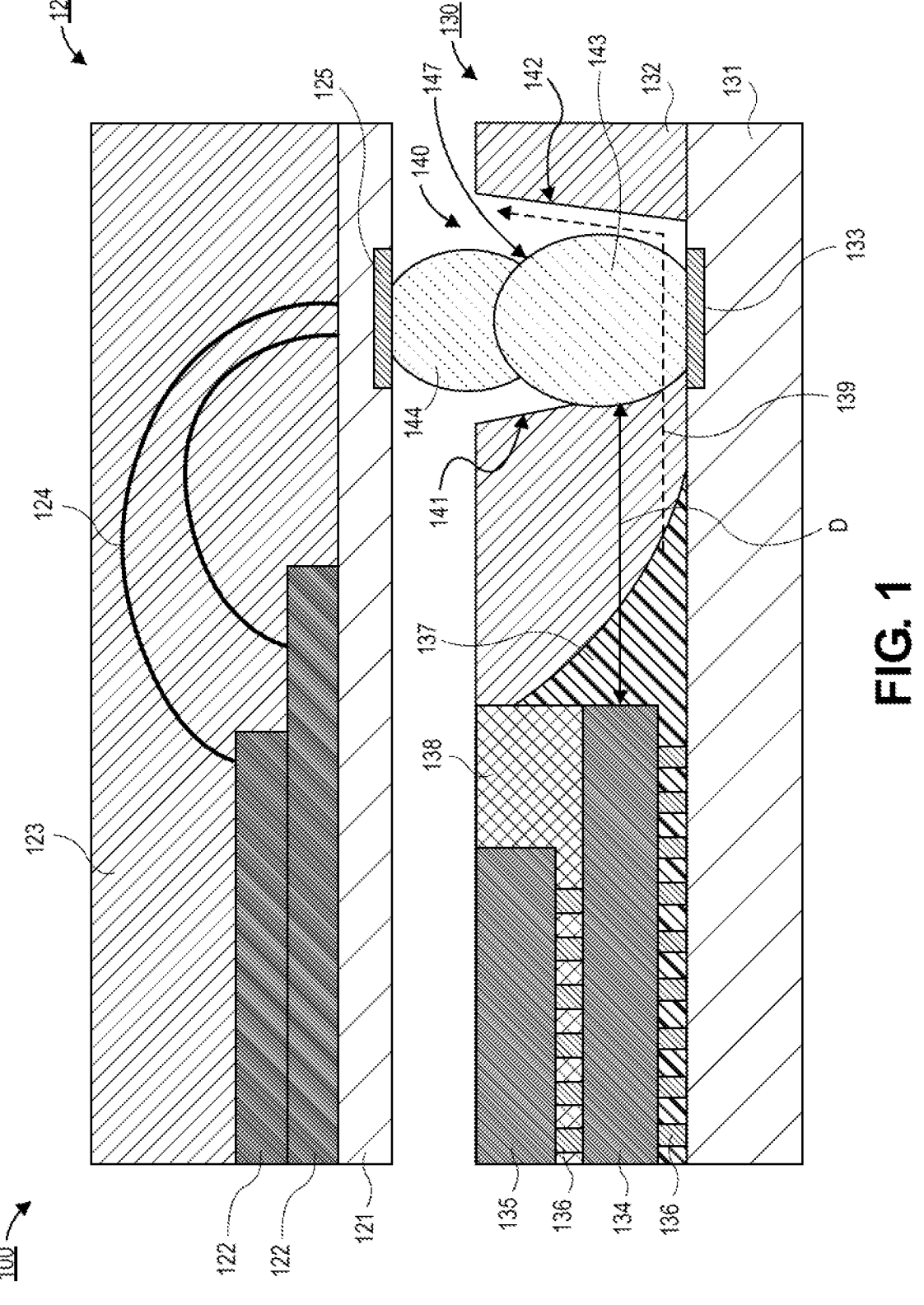
FIG. 1 is a cross-sectional illustration of an electronic system that includes a first package and a second package in a package-on-package (PoP) architecture with a vent for the through mold interconnect (TMI), in accordance with an embodiment.

Described herein are electronic packages with vents for through mold interconnects (TMIs), in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, compact electronic systems that include the use of package-on-package (PoP) architectures often suffer from ball lifting defects during assembly. It has been shown that moisture outgassing from organic materials in a package assembly (particularly from the capillary underfill (CUF) material) is the primary driving force behind the ball lifting. Accordingly, embodiments disclosed herein provide a vent alongside the through mold interconnects (TMIs) that allows for the outgassed moisture to escape through the mold layer and eliminates the scenario of a high vapor pressure building up against the solder balls.

Such vent architectures are particularly useful because they are compatible with the tight spacing of advanced packaging architectures. For example, for TMIs adjacent to the CUF with a tight keep-out zone, the vent may be formed on an edge of the TMI that is opposite from the CUF. Accordingly, there is no problem with needing to ablate both mold material and CUF material. That is, existing laser processes may be used to form the vents. Furthermore, the vents also provide an outgassing path that does not need to pass through the package substrate. Accordingly, there is no need to redesign the conductive layers of the package substrate to accommodate outgassing pathways. Therefore, the conductive layers can be optimized for electrical performance without the need to consider outgassing issues.

Additionally, it has been found that the outgassing that causes ball lifting primarily affects the interior TMIs (i.e., the TMIs closest to the die and CUF since the CUF is the primary source of outgassed moisture). Accordingly, embodiments may include providing the vent feature only on the interior TMIs. That is, the TMIs in rows outside the innermost row can be formed with standard processing without the need for vents. However, it is to be appreciated that embodiments may also include vents formed in other rows (i.e., proximate to the package edge or on internal rows of TMI) without significantly compromising the mechanical integrity of the package and losing the positive benefits of mold in package warpage control.

Referring now to FIG. 1, a cross-sectional illustration of an electronic package 100 is shown, in accordance with an embodiment. In an embodiment, the electronic package 100 may comprise a PoP architecture. That is, the electronic package 100 may comprise a first package 130 and a second package 120. In an embodiment, the first package 130 may also be referred to as a bottom package, a system-on-a-chip (SoC) package, a multi-chip package (MCP), or the like. In an embodiment, the second package 120 may be referred to as a top package, a memory package, or the like.

In an embodiment the second package 120 may comprise one or more dies 122. For example, two dies 122 are shown in FIG. 1. In the case where a plurality of dies 122 are used, the dies 122 may be stacked over each other. The stacked dies 122 may be offset from each other to allow for wire bonds 124 to provide electrical connection to a pad 125 on a side of a solder resist layer 121 opposite from the dies 122. In an embodiment, a mold layer 123 may embed the one or more dies 122. In a particular embodiment, the one or more dies 122 are memory dies. However, it is to be appreciated that the dies 122 may comprise any type of die.

In an embodiment, the first package 130 may comprise a package substrate 131. The package substrate 131 may include layers of insulating material (e.g., build-up layers, etc.) with conductive features (e.g., traces, vias, pads, etc.). For simplicity, the plurality of layers and the majority of the conductive features are omitted. However, a pad 133 below the solder ball 143 is shown. The pad 133 may be electrically coupled to the one or more dies 134/135 by conductive traces in the package substrate 131. In an embodiment, the first die 134 may be electrically coupled to the package substrate 131 by interconnects 136. In an embodiment, the interconnects 136 are shown as a single copper bump. However, it is to be appreciated that the interconnects 136 may comprise any suitable interconnect architecture. In some embodiments, the interconnects 136 may be referred to generally as first level interconnects (FLIs). In an embodiment, the second die 135 may be electrically coupled to the first die 134 by interconnects 136.

In an embodiment, the first die 134 comprises transistors that are fabricated at a first process node, and the second die 135 comprises transistors that are fabricated at a second process node that is more advanced than the first process node. However, it is to be appreciated that the first die 134 and the second die 135 may also be formed at the same process node in some embodiments. Furthermore, while two dies 134/135 are shown, it is to be appreciated that in some embodiments the first package 130 may include single die. Other embodiments may include a plurality of first dies 134 and/or a plurality of second dies 135.

In an embodiment, a capillary underfill (CUF) material 137 may be disposed under the first die 134. The CUF material 137 may surround the interconnects 136 below the first die 134. The CUF material 137 may also extend out away from the edge of the first die 134. For example, the CUF material 137 may extend towards the solder ball 143. In an embodiment, the second die 135 may be embedded in a mold layer 138. Other embodiments may include embedding (or partially embedding) the second die 135 with the CUF material 137.

In an embodiment, a mold layer 132 is disposed over a surface of the package substrate 131. The mold layer 132 may embedded and/or surround the first dies 134 and the second die 135. In and embodiment, the mold layer 132 directly contacts portions of the CUF material 137. The mold layer 132 is a different material than the CUF material 137. In a particular embodiment, the CUF material 137 is a material that more readily absorbs moisture compared to the mold layer 132. Accordingly, during attachment of the second package 120, significant outgassing from the CUF material 137 occurs.

In an embodiment, the first package 130 is electrically coupled to the second package 120 by one or more through mold interconnects (TMIs) 147. The TMIs 147 may comprise the solder ball 143 and a solder ball 144. While shown as two distinct balls, it is to be appreciated that the solder ball 143 may merge with the solder ball 144 during attachment of the second package 120 to the first package 130. Accordingly, an electrical path from pad 125 of the second package 120 to the pad 133 of the first package 130 is provided by the TMI 147.

In an embodiment, the TMI 147 passes through a through mold opening 140. In an embodiment, the through mold opening 140 comprises a first opening 141 and a second opening 142. The first opening 141 may extend down into the mold layer 132 and land on a surface of the solder ball 143. In an embodiment, the first opening 141 may be augmented by the addition of a second opening 142. The second opening 142 may also be referred to herein as a vent. The second opening 142 passes entirely through the mold layer 132. Accordingly, the second opening 142 may expose a portion of the surface of the package substrate 131.

In an embodiment, the second opening 142 is on an edge of the TMI 147 that is opposite from the die 134. Accordingly, the additional second opening 142 is spaced away from the CUF material 137. Accordingly, the formation of the second opening 142 only requires drilling through the mold layer 132. Due to the tight spacing D between the die 134 and the TMI 147, forming a vent between the TMI 147 and the die 134 is not a feasible solution. Particularly, since the laser is optimized for ablating the mold layer 132, it is difficult to form a vent that passes through both the CUF material 137 and the mold layer 132. In an embodiment, the spacing D may be approximately 500 µm or less.

The second opening 142 provides a path around the TMI 147 through which moisture can vent. For example, a path 139 of moisture from the CUF material 137 through mold layer 132 and out the second opening 142 is shown, in accordance with an embodiment. While the path 139 shown in FIG. 1 passes through the TMI 147, it is to be appreciated that the path 139 would typically wrap around the TMI 147 (out of the plane of FIG. 1) instead of directly passing through the TMI 147 as shown.

In the cross-sectional illustration shown in FIG. 1, the through mold opening 140 appears as a single continuous opening. For example, the first opening 141 defines a first edge of the opening and the second opening 142 defines a second edge of the opening. From such a perspective, the center of the TMI 147 will be offset from a center of the through mold opening 140. Particularly, the center of the TMI 147 will be shifted towards the die 134. However, it is to be appreciated that in some embodiments (and from different perspectives), the distinction between the first opening 141 and the second opening 142 is more distinguishable.

Figure 2A:
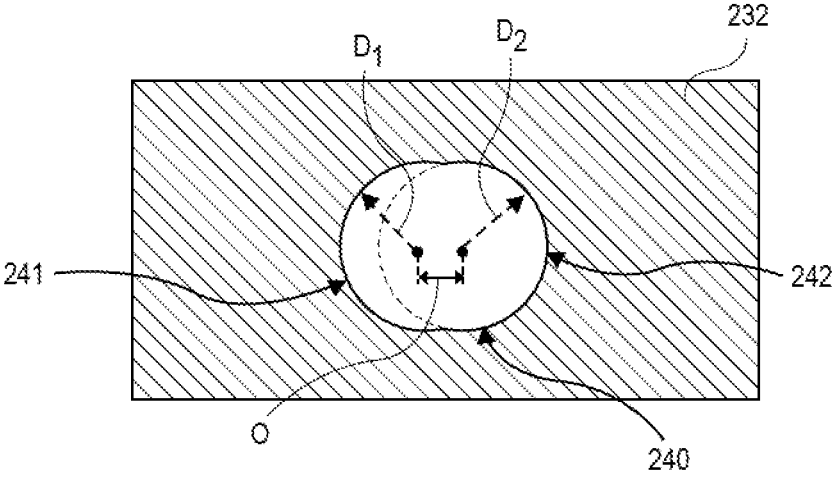
FIG. 2A is a plan view illustration of the through mold opening and a vent, in accordance with an embodiment.
Figure 2B:
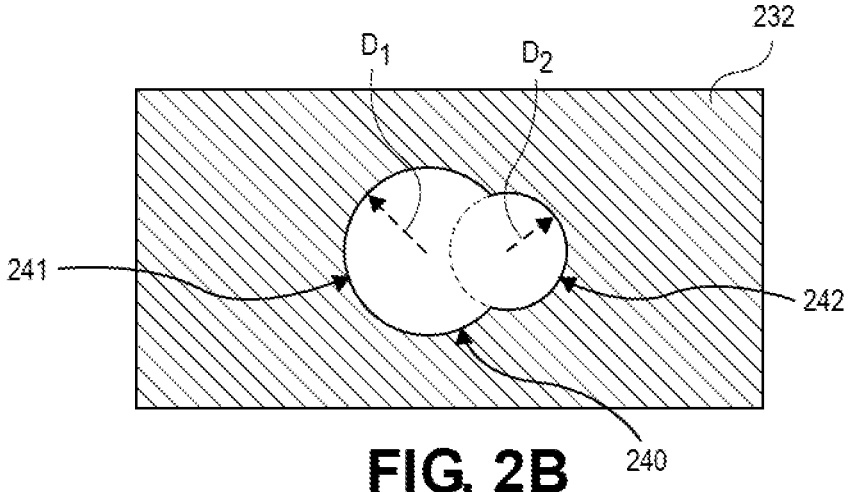
FIG. 2B is a plan view illustration of the through mold opening and a vent with a smaller diameter than the through mold opening, in accordance with an embodiment.
Figure 2C:
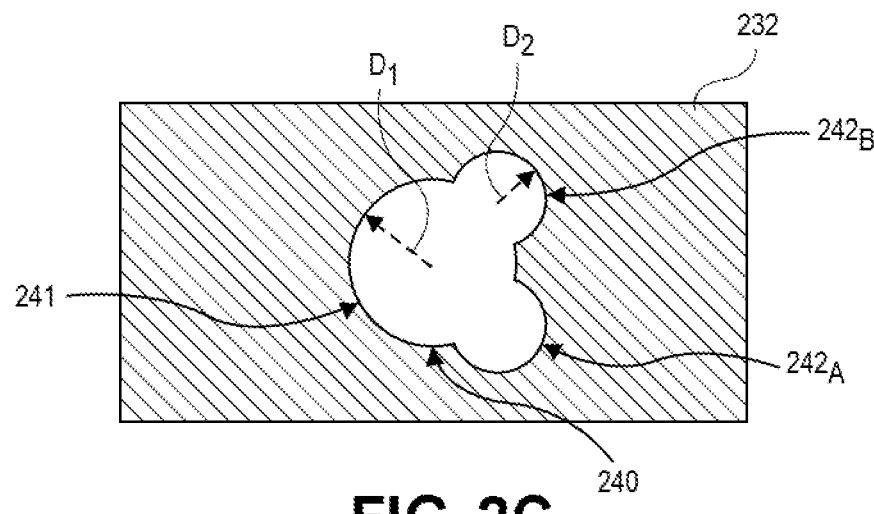
FIG. 2C is a cross-sectional illustration of the through mold opening and a pair of vents, in accordance with an embodiment.

Referring now to FIGS. 2A-2C, a series of plan view illustrations of a portion of the mold layer 232 is shown, in accordance with various embodiments. The view shown in FIG. 2A-2C more clearly illustrates the intersection of the first opening 241 and the second opening 242. In FIGS. 2A-2C the underlying layers (e.g., a pad and the package substrate) and the TMI are omitted in order to not obscure the illustration of the through mold opening 240.

Referring now to FIG. 2A, a plan view illustration of a portion of the mold layer 232 is shown, in accordance with an embodiment. In an embodiment, the mold layer 232 includes a through mold opening 240. As shown, the through mold opening 240 includes a first opening 241 and a second opening 242. The first opening 241 may have a first diameter $D_1$ and second opening 242 may have a second diameter $D_2$. In the illustrated embodiment, the first diameter $D_1$ and the second diameter $D_2$ may be substantially equal to each other. However, as will be described above, the first diameter $D_1$ may be different than the second diameter $D_2$.

As shown, the second opening 242 intersects the first opening 241. For example, an offset O between the center point of the second opening 242 relative to the center point of the first opening 241 may be approximately 30 µm or less. In a particular embodiment, the offset O may be approximately 10 µm or less. Depending on the amount of the offset O, the shape of the through mold opening 240 will change. For example, the through mold opening 240 may appear oval shaped at low offsets O, and an indent may appear as the offset O increases.

Referring now to FIG. 2B, a plan view illustration of a portion of a mold layer 232 is shown, in accordance with an additional embodiment. As shown, the through mold opening 240 includes a first opening 241 and a second opening 242 that intersects the first opening 241. In an embodiment, the first opening 241 comprises a first diameter $D_1$ and the second opening 242 comprises a second diameter $D_2$. In an embodiment, the second diameter $D_2$ is different than the first diameter $D_1$. Particularly, the second diameter $D_2$ is shown as being smaller than the first diameter $D_1$.

Referring now to FIG. 2C, a plan view illustration of a portion of a mold layer 232 is shown, in accordance with an additional embodiment. In an embodiment, a through mold opening 240 may be formed through the mold layer 232. The through mold opening 240 may comprise a first opening 241 and a plurality of second openings 242. For example two second openings 242A and 242B are shown. In an embodiment, the second openings 242 may each intersect the first opening 241. The first opening 241 may have a first diameter $D_1$ and the second openings 242 may have a second diameter $D_2$ that is different than the first diameter $D_1$. For example, the second diameter $D_2$ is shown as being smaller than the first diameter $D_1$. Furthermore, while both second openings 242 are shown with substantially the same diameter $D_2$, it is to be appreciated that the second openings 242 need not have the same diameter. Additionally, the second openings 242A and 242B may have different offsets from the first opening 241.

Referring now to FIGS. 3A-3D, a series of illustrations depicting a process for forming a through mold opening 340 in an electronic package 330 is shown, in accordance with an embodiment. In FIGS. 3A-3D, only a portion of the electronic package 330 is shown for simplicity. However, it is to be appreciated that the electronic package 330 may be similar to the first package 130 in FIG. 1.

Figure 3A:
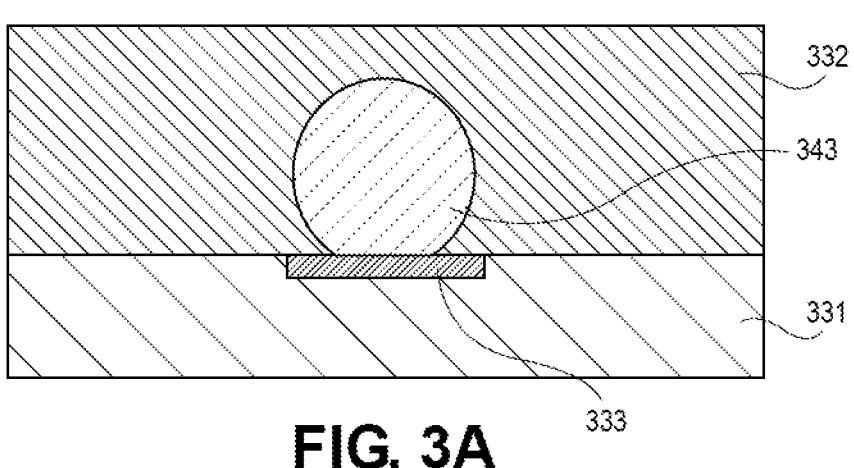
FIG. 3A is a cross-sectional illustration of a package with a solder ball embedded in a mold layer, in accordance with an embodiment.

Referring now to FIG. 3A, a cross-sectional illustration of a portion of an electronic package 330 is shown, in accordance with an embodiment. In the illustrated portion, a package substrate 331 and a mold layer 332 over the package substrate 331 is shown. The mold layer 332 may embed a solder ball 343. In an embodiment, the solder ball 343 is positioned over a pad 333. The pad 333 may be electrically coupled to one or more dies (not shown) of the electronic package 330 through conductive features in the package substrate 331.

Figure 3B:
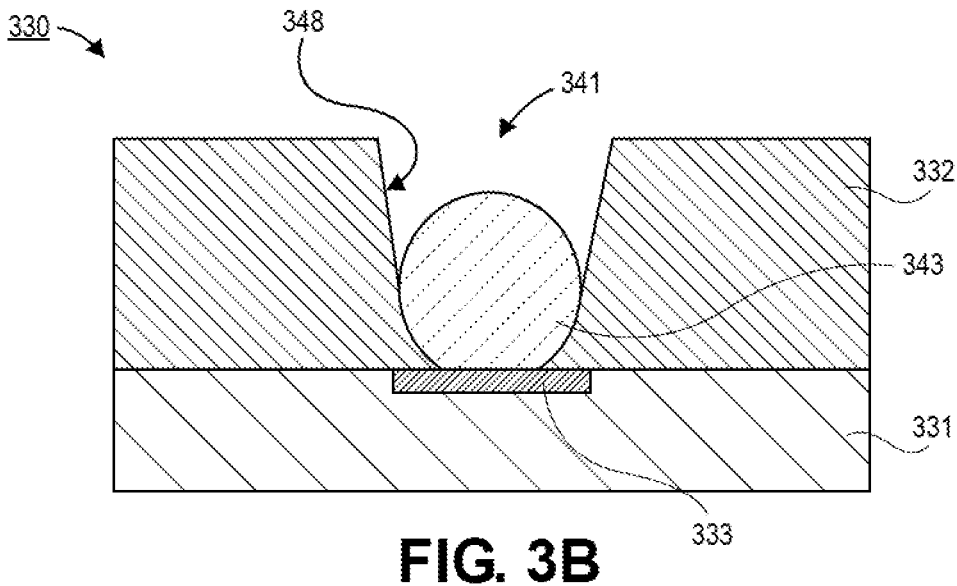
FIG. 3B is a cross-sectional illustration of the package after an opening is formed through the mold layer, in accordance with an embodiment.

Referring now to FIG. 3B, a cross-sectional illustration of the electronic package 330 after a first opening 341 is formed into the mold layer 332 is shown, in accordance with an embodiment. In an embodiment, the first opening 341 may expose a portion of the solder ball 343. In a particular embodiment, the first opening 341 intersects the solder ball 343. That is, the sidewalls 348 of the first opening 341 terminate on a surface of the solder ball 343. Accordingly, the first opening 341 does not extend all the way through a thickness of the mold layer 332. In an embodiment, the centerline of the solder ball 343 may be substantially aligned with a centerline of the first opening 341.

In an embodiment, the first opening 341 may be formed with any suitable process. For example, the first opening 341 may be formed with a laser drilling process. As is typical with laser drilling, the sidewalls 348 may have a tapered profile. That is, a diameter at the top of the first opening 341 may be greater than a diameter at the bottom of the first opening 341.

Figure 3C:
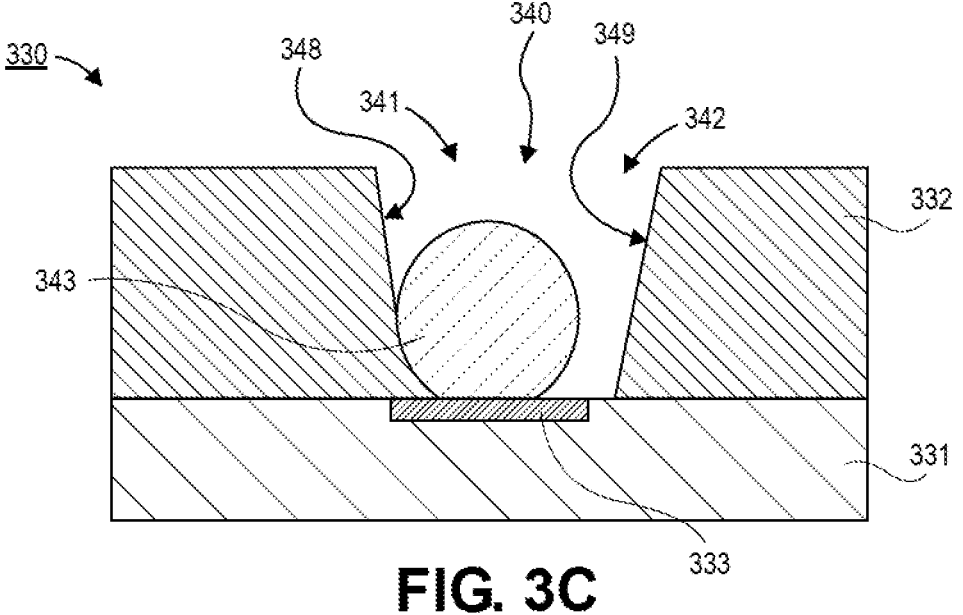
FIG. 3C is a cross-sectional illustration of the package after a vent is formed through the mold layer, in accordance with an embodiment.

Referring now to FIG. 3C, a cross-sectional illustration of the electronic package 330 after a second opening 342 is formed into the mold layer 332 is shown, in accordance with an embodiment. In an embodiment, the second opening 342 may extend all the way through a thickness of the mold layer 332. That is, the sidewall 349 of the second opening 342 may terminate at the surface of the package substrate 331. In an embodiment, the second opening 342 exposes a portion of the surface of the package substrate 331.

In an embodiment, the second opening 342 is offset from the first opening 341 and intersects the first opening 341 to form a through mold opening 340. That is, the through mold opening 340 comprises the first opening 341 and the second opening 342. In an embodiment, the addition of the second opening 342 results in a centerline of the solder ball 343 being offset from a centerline of the through mold opening 340. Additionally, the second opening 342 provides a venting path that allows for moisture or the like to vent out of the electronic package 330 without providing enough pressure on the solder ball 343 to cause ball lifting.

Figure 3D:
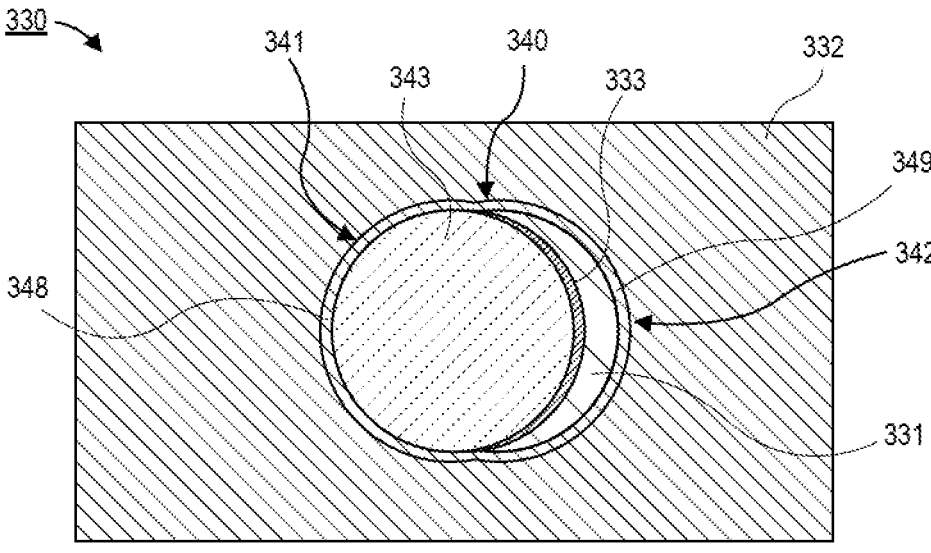
FIG. 3D is a plan view illustration of the package in FIG. 3C, in accordance with an embodiment.

Referring now to FIG. 3D, a plan view illustration of the electronic package 330 in FIG. 3C is shown, in accordance with an embodiment. The sidewalls 348 and 349 of the first opening 341 and the second opening 342 are visible in the plan view due to their tapered profile. The exposed surface of the package substrate 331 is also clearly visible. In a particular embodiment, the exposed surface of the package substrate 331 may be crescent shaped. However, the shape of the exposed surface of the package substrate may vary, depending on the shapes, sizes, offsets, etc. of the first opening 341 and the second opening 342. In an embodiment, a portion of the pad 333 may also be exposed. In other embodiments, the solder ball 343 may entirely cover the pad 333 and it will not be visible.

Figure 4A:
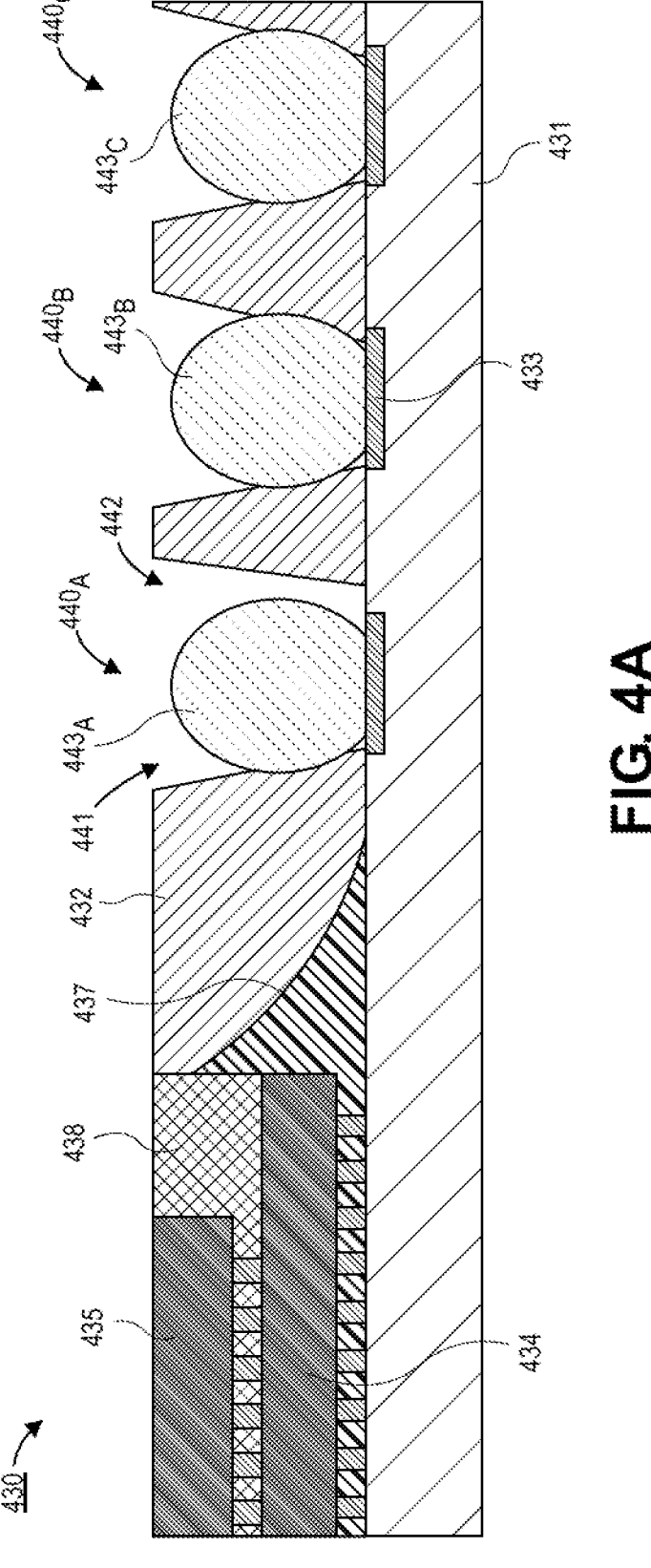
FIG. 4A is a cross-sectional illustration of an electronic package with a plurality of rows of TMIs with the TMI in the first row including a vent, in accordance with an embodiment.
Figure 4B:
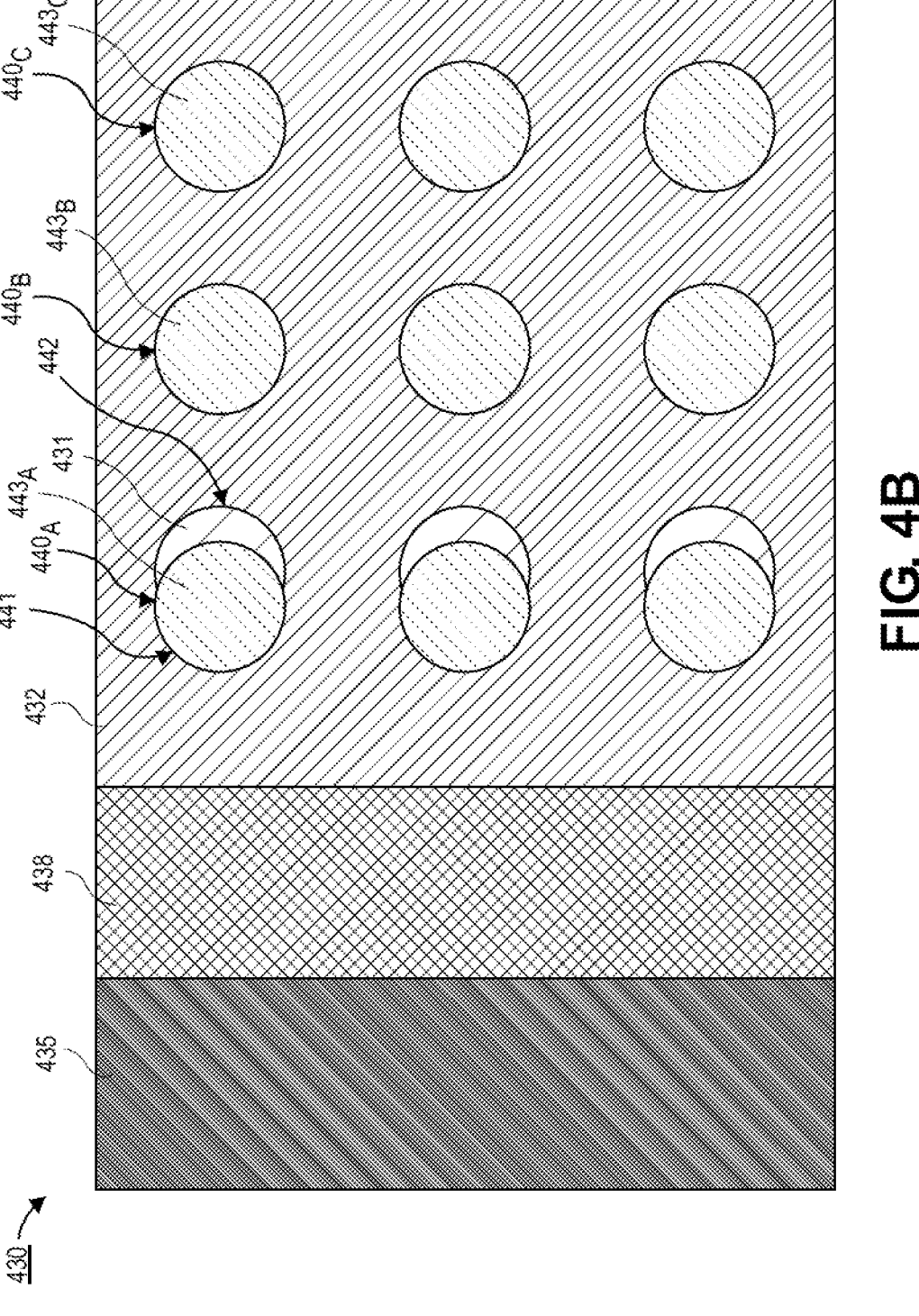
FIG. 4B is a plan view illustration of the electronic package in FIG. 4A, in accordance with an embodiment.

Referring now to FIGS. 4A and 4B, a cross-sectional illustration and a corresponding plan view illustration of an electronic package 430 is shown, in accordance with an additional embodiment. The electronic package 430 may be similar to the first electronic package 130 in FIG. 1, with the exception that a plurality of solder balls 443$_{A-C}$ and a plurality of through mold openings 440$_{A-C}$ are included. For example, the electronic package 430 comprises a package substrate 431, a first die 434, a second die 435, a CUF material 437 and mold layers 432 and 438.

In an embodiment, the solder balls 443$_{A-C}$ may each be positioned on a pad 433. The first row of solder balls 443$_A$ is considered the innermost row of solder balls 443. That is, the first solder balls 443$_A$ are closer to the die 434 than the second row of solder balls 443$_B$ and the third row of solders ball 443$_C$. Furthermore, while three rows of solder balls 443 are shown, it is to be appreciated that any number of rows of solder balls 443 may be included depending on the needs of the electronic package 430. In an embodiment, each of the solder balls 443 may be substantially similar to each other. That is, the volume of solder in each solder ball 443$_A$ in the first row may be substantially similar to the volume of solder in each solder ball 443 in any of the other rows.

In an embodiment, the through mold openings 440 are not uniform for each of the rows. Particularly, the through mold openings 440$_A$ in the first row are larger than the through mold openings 440$_{B-C}$ in the second row and the third row. For example, the through mold openings 440$_A$ may comprise a first opening 441 and a second opening 442 that intersects the first opening 441. In an embodiment, centerlines of the first solder balls 443$_A$ may be offset from the centerline of the through mold opening 440$_A$. This allows for the second opening 442 to expose a portion of the package substrate 431.

In an embodiment, the second opening 442 is located along an edge of the solder ball 443$_A$ that is opposite from the die 434. This allows for existing laser ablation processes to be used to form the second opening 442. Particularly, the second opening 442 only passes through the mold layer 432, so there is no need for adjusting the laser ablation process from the one used to form the first opening 441. If the second opening were to be formed on the side of the solder ball 443$_A$ closest to the die 434, then the laser ablation process would need to account for the presence of the CUF material 437, and require additional refinement of the laser ablation process.

Accordingly, outgassing from the CUF material 437 may escape up through the second opening 442 of the first through mold openings 440$_A$. Since the pressure from outgassed moisture is relieved at the first through mold openings 440$_A$, there is not sufficient pressure in the subsequent rows to produce ball lifting. Accordingly, in some embodiments, only the first row of through mold openings 440$_A$ include a second opening (vent) 442.

Figure 4C:
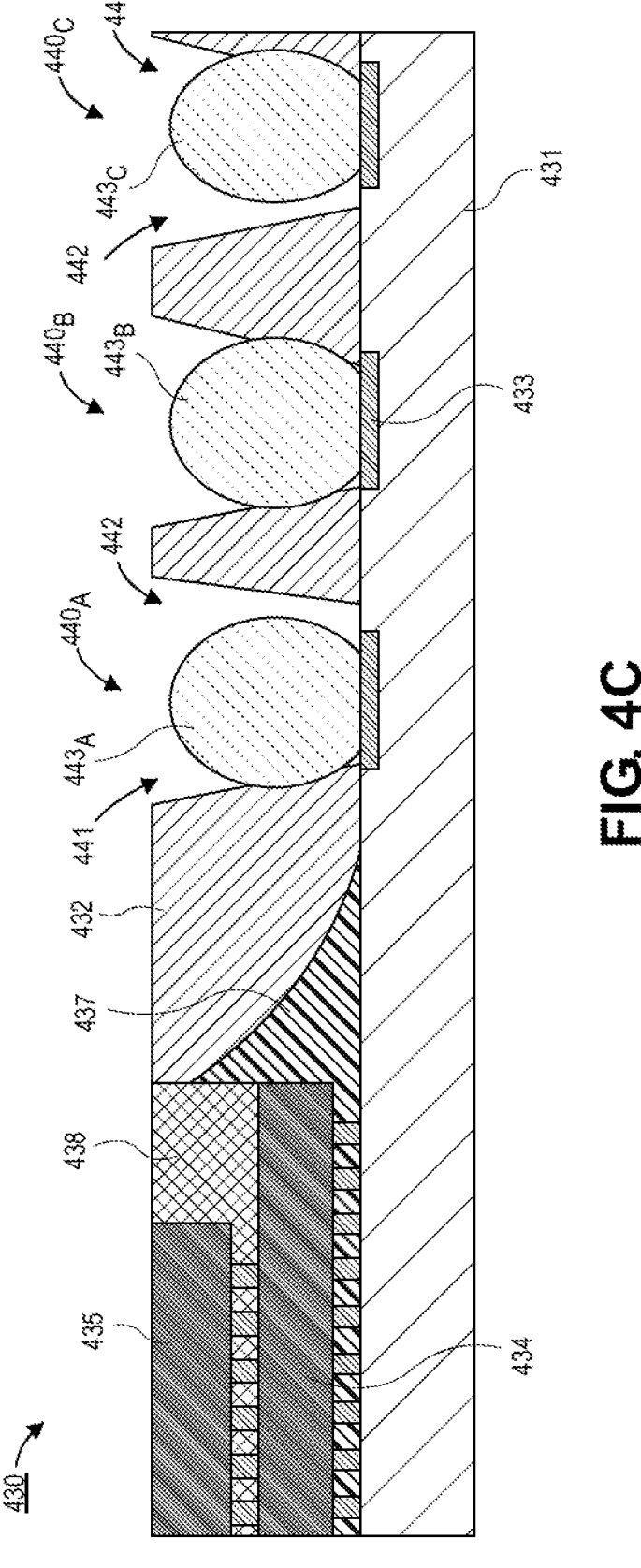
FIG. 4C is a cross-sectional illustration of an electronic package with a plurality of rows of TMIs with vents being formed along more than one row, in accordance with an embodiment.

However, it is to be appreciated that second openings 442 may optionally be added to any of the rows of through mold openings 440. FIG. 4C provides an example of such an embodiment. As shown, a second openings 442 may also be formed along the outermost row of solder balls 443$_C$. For example, the through mold openings 440$_C$ may comprise a first opening 441 and a second opening 442 that intersects the first opening 441. In an embodiment, the second opening 442 may be positioned towards the interior of the package 430 in order to maintain structural integrity.

Figure 5:
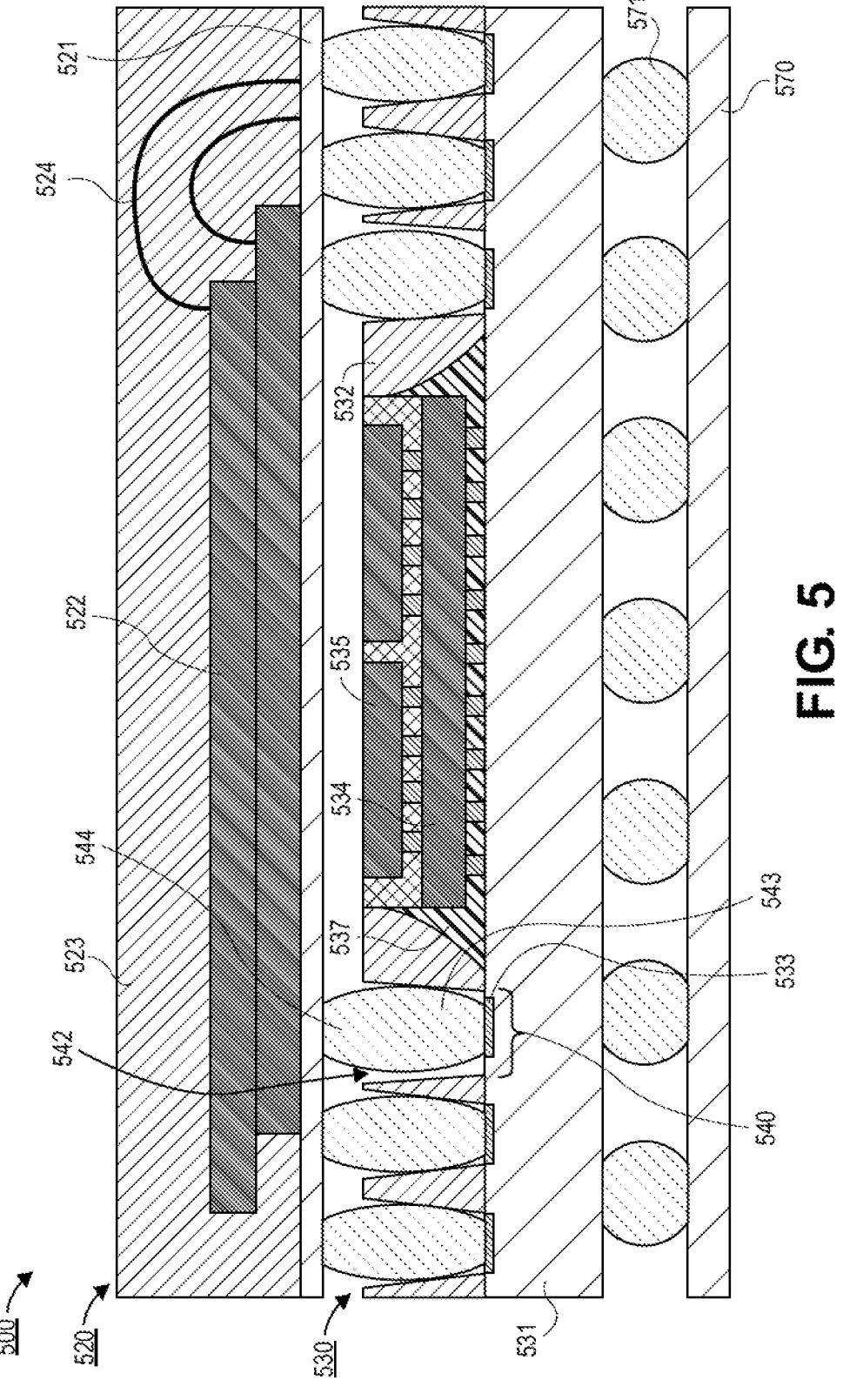
FIG. 5 is a cross-sectional illustration of an electronic system that comprises a PoP architecture with TMIs that include vents, in accordance with an embodiment.

Referring now to FIG. 5, a cross-sectional illustration of an electronic system 500 is shown, in accordance with an embodiment. In an embodiment, the electronic system 500 comprises a board 570, a first electronic package 530, and second electronic package 520.

In an embodiment, the board 570 may be any suitable board. For example, the board 570 may be a mother board, a printed circuit board (PCB) or the like. In an embodiment, the board 570 is electrically coupled to the first electronic package 530. For example, the board 570 may be electrically coupled to the first electronic package 530 with any suitable interconnect architecture 571. For example the interconnect architecture 571 is shown as being solder balls, but other interconnect architectures (e.g., sockets, wire bonds, etc.) may be used.

In an embodiment, the first electronic package 530 may comprise a package substrate 531. The package substrate 531 is electrically coupled to the board 570. In an embodiment, a plurality of dies 534/535 may be electrically coupled to the package substrate 531. In an embodiment, a first die 534 may be a base die onto which a plurality of second dies 535 are attached. The first die 534 may be formed at a first process node, and the second dies 535 may be formed at a second process node that is more advanced than the first process node. In an embodiment, a CUF material 537 may surround the first die 534. In an embodiment, the CUF material 537 may extend out laterally towards TMIs 540. In an embodiment, a mold layer 532 may be disposed over the package substrate 531 and around the dies 534/535.

In an embodiment, the plurality of dies 534/535 may be electrically coupled to pads 533 onto which TMIs 540 are positioned. In an embodiment, the TMIs may comprise a solder ball 543 that has merged with a second solder ball 544. In an embodiment, the innermost TMIs 540 (i.e., the TMIs 540 closest to the die 534) may further comprise a vent 542. The vent 542 is part of a through mold opening that provides access to the solder ball 543. In an embodiment, the vent 542 may extend all the way through the mold layer 532 so that a portion of the package substrate 531 is exposed. In an embodiment, the vent 542 provides a pathway through which outgassed moisture from the CUF material 537 escapes during the attachment of the second electronic package 520. Accordingly, ball lifting is eliminated since the vent reduces pressure on the bottom surface of the solder balls 543. In an embodiment, the vent 542 is separated from the die 534 by the solder ball 543. Positioning the vent 542 opposite from the die 534 prevents the vent 542 from needing to be drilled through the CUF material 537. Accordingly, the spacing between the innermost TMIs 540 and the die 534 can be minimized. For example, the spacing between the innermost TMIs 540 and the die 534 may be approximately 500 μm or less. In some embodiments, only the innermost TMIs 540 include a vent 542.

In an embodiment, the second electronic package 520 is electrically coupled to the first electronic package by the TMIs 540. In an embodiment, the second electronic package 520 may comprise one or more dies 522 that are electrically coupled to the first electronic package 530 by wire bonds 524 or any other suitable interconnect. A solder resist layer 521, redistribution layers or the like may be below the one or more dies 522. In an embodiment, a mold layer 523 may embed the wire bonds 524 and the one or more dies 522.

Figure 6:
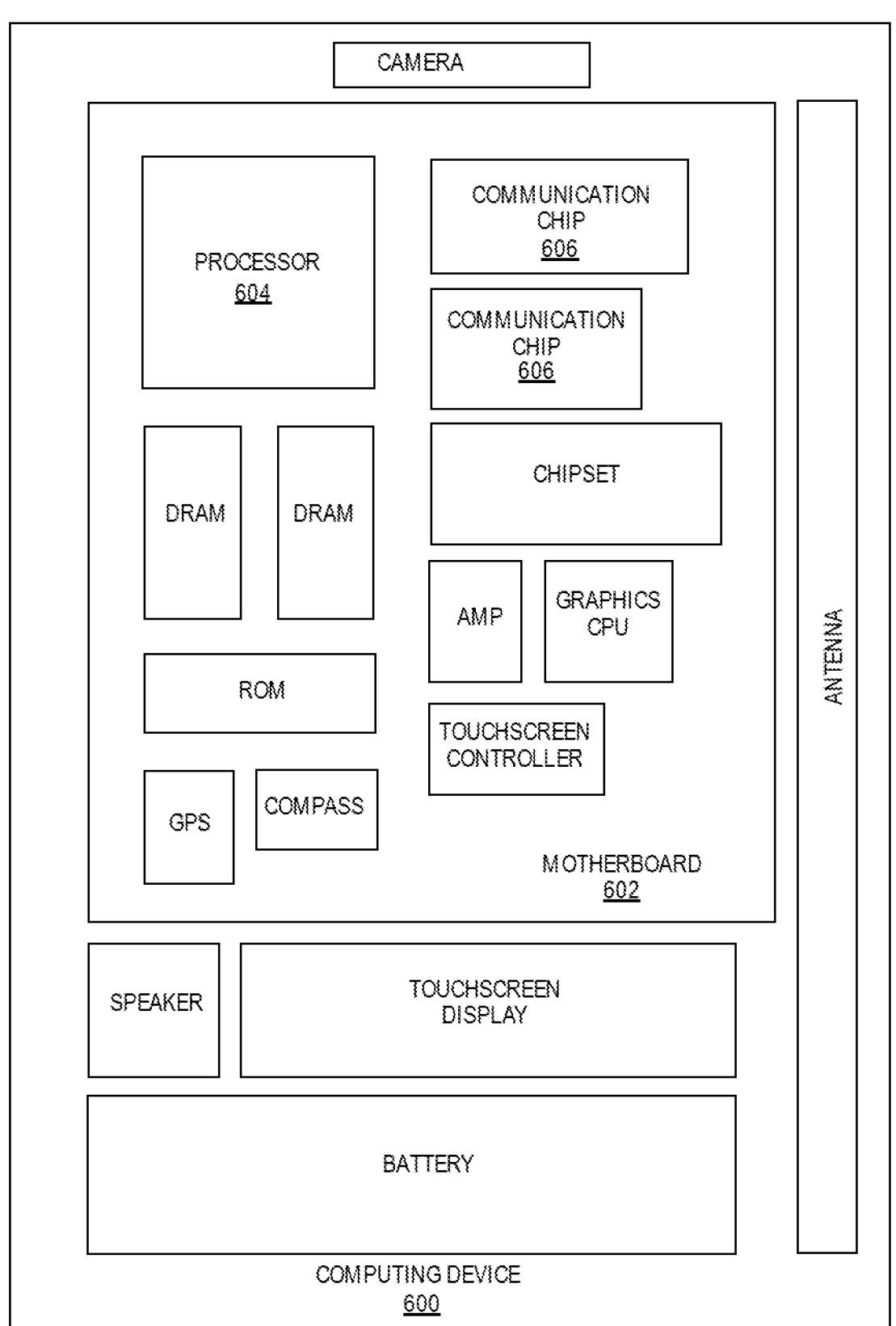
FIG. 6 is a schematic of a computing device built in accordance with an embodiment.

FIG. 6 illustrates a computing device 600 in accordance with one implementation of the invention. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. In some implementations of the invention, the integrated circuit die of the processor 604 may be part of an electronic package that comprises a TMI with a vent opposite from the processor 604, in accordance with embodiments described herein. The term "processor" may refer to any device or portion of a device that processes electronic data from registers and/or memory to transform that electronic data into other electronic data that may be stored in registers and/or memory.

The communication chip 606 also includes an integrated circuit die packaged within the communication chip 606. In accordance with another implementation of the invention, the integrated circuit die of the communication chip 606 may be part of an electronic package that comprises a TMI with a vent opposite from the communication chip 606, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: an electronic package, comprising: a package substrate; a first die electrically coupled to the package substrate; a mold layer over the package substrate and around the first die; a through mold opening through the mold layer; and a through mold interconnect (TMI) in the through mold opening, wherein a center of the TMI is offset from a center of the through mold opening.

Example 2: the electronic package of Example 1, wherein the through mold opening comprises: a first opening; and a second opening, wherein the second opening intersects the first opening.

Example 3: the electronic package of Example 2, wherein a diameter of the first opening is substantially equal to a diameter of the second opening.

Example 4: the electronic package of Example 2, wherein a diameter of the first opening is different than a diameter of the second opening.

Example 5: the electronic package of Examples 1-4, wherein the first die is separated from the second opening by the TMI.

Example 6: the electronic package of Examples 1-5, wherein an edge of the TMI nearest the first die is spaced away from the first die by approximately 500 μm or less.

Example 7: the electronic package of Examples 1-6, wherein the through hole opening exposes a surface of the package substrate.

Example 8: the electronic package of Examples 1-7, further comprising: a second package electrically coupled to the first die by the TMI.

Example 9: the electronic package of Examples 1-8, further comprising: a plurality of second dies over the first die.

Example 10: the electronic package of Examples 1-9, further comprising: a capillary underfill (CUF) material under the first die and between the TMI and the first die.

Example 11: an electronic package comprising: a package substrate; a die on the package substrate; a mold layer over the package substrate; a row of first through mold interconnects (TMIs) adjacent to an edge of the die, wherein each first TMI comprises a vent; and a row of second TMIs separated from the edge of the die by the row of first TMIs.

Example 12: the electronic package of Example 11, wherein the vents are positioned along an edge of the first TMIs opposite from the edge of the die.

Example 13: the electronic package of Example 11 or Example 12, wherein the vents expose a surface of the package substrate.

Example 14: the electronic package of Examples 11-13, wherein the TMIs comprise: a solder interconnect; and an opening into the mold layer.

Example 15: the electronic package of Example 14, wherein the vents intersect the opening.

Example 16: the electronic package of Examples 11-15, further comprising: a capillary underfill (CUF) layer under the die and between the edge of the die and the row of first TMIs.

Example 17: the electronic package of Examples 11-16, wherein the row of first TMIs is spaced away from the edge of the die by approximately 500 µm or less.

Example 18: the electronic package of Examples 11-17, further comprising: a second package coupled to the row of first TMIs and the row of second TMIs.

Example 19: an electronic system, comprising: a first package, wherein the first package comprises: a package substrate; a mold layer over the package substrate; a through mold interconnect (TMI), wherein the TMI comprises a vent; and a second package electrically coupled to the first package by the TMI.

Example 20: the electronic system of Example 19, wherein the first package comprises a plurality of dies.

Example 21: the electronic system of Example 20, wherein the second package comprises a memory die.

Example 22: the electronic system of Examples 19-21, wherein the vent exposes a surface of the package substrate.

Example 23: the electronic system of Examples 19-22, wherein the TMI further comprises: a first opening, wherein the first opening has a first diameter, and wherein the vent intersects the first opening, and wherein the vent comprises an arc having the first diameter.

Example 24: the electronic system of Examples 19-23, further comprising: a second TMI, wherein the second TMI does not include a vent.

Example 25: the electronic system of Examples 19-24, further comprising: a board electrically coupled to the package substrate.

What is claimed is:

1. An electronic system, comprising:
a bottom package comprising a first package substrate having a top side and an opposite bottom side, a first die coupled to the top side of the first package substrate by interconnects, and underfill material around the interconnects and along an entirety of sidewalls of the first die, a first mold layer over the first package substrate and surrounding the underfill material and the first die, and a through mold interconnect through the first mold layer and laterally adjacent to the first die, the through mold interconnect comprising a first conductive portion on the top surface of the first package substrate, and a second conductive portion on the first conductive portion, the second conductive portion distinct from the first conductive portion, wherein the first conductive portion has a maximum lateral width greater than a maximum lateral width of the second conductive portion, and the bottom package comprising a second mold layer in contact with the first mold layer and a top surface of the first die, the second mold layer having a planar bottom surface along the top surface of the first die; and
a top package coupled to the bottom package, the top package comprising a second package substrate having a top side and an opposite bottom side, a second die above and coupled to the top side of the second package substrate by a first wire bond, and a third die over the second die, the third die laterally offset from the second die, and the third die coupled to the top side of the second package substrate by a second wire bond, and a third mold layer over the second die and the third die and over the second package substrate, wherein the first die of the bottom package extends laterally beyond a sidewall of the third die.

2. The electronic system of claim 1, wherein the first conductive portion of the through mold interconnect is a solder ball.

3. The electronic system of claim 1, wherein the second conductive portion of the through mold interconnect is a solder ball.

4. The electronic system of claim 1, wherein the first conductive portion of the through mold interconnect is a first solder ball, and wherein the second conductive portion of the through mold interconnect is a second solder ball.

5. The electronic package of claim 1, wherein the through mold interconnect of the bottom package is in a through mold opening, and wherein the through mold opening has a first sloped sidewall and a second sloped sidewall from a cross-sectional perspective.

6. The electronic package of claim 5, wherein a center of the through mold interconnect of the bottom package is offset from a center of the through mold opening.

7. The electronic package of claim 1, wherein the through mold interconnect of the bottom package is in a through mold opening, and a center of the through mold interconnect is offset from a center of the through mold opening.

8. An electronic system, comprising:
a lower package comprising a first package substrate, a first die coupled to the first package substrate by first interconnects, and capillary underfill around the first interconnects and along an entirety of sidewalls of the first die, a first mold material over the first package substrate and surrounding the capillary underfill with a curved interface between the first mold material and the capillary underfill, and a second interconnect through the first mold material and laterally adjacent to the first die, the second interconnect comprising a first conductive portion on the first package substrate, and a second conductive portion on the first conductive portion, the second conductive portion distinct from the first conductive portion, wherein the first conductive portion has a maximum lateral width greater than a maximum lateral width of the second conductive portion, and the lower package comprising a second mold material in contact with the first mold material and a top surface of the first die, the second mold material having a planar bottom surface along the top surface of the first die; and
an upper package coupled to the lower package, the upper package comprising a second package substrate, a second die above and coupled to the second package substrate by a first wire bond, and a third die over the second die, the third die laterally offset from the second die, and the third die coupled to the second package substrate by a second wire bond, and a third mold material over the second die and the third die and over the second package substrate, wherein the first die of the lower package extends laterally beyond a sidewall of the third die.

9. The electronic system of claim 8, wherein the first conductive portion of the second interconnect is a solder ball.

10. The electronic system of claim 8, wherein the second conductive portion of the second interconnect is a solder ball.

11. The electronic system of claim 8, wherein the first conductive portion of the second interconnect is a first solder ball, and wherein the second conductive portion of the second interconnect is a second solder ball.

12. The electronic package of claim 8, wherein the second interconnect is in an opening in the first mold material, and wherein the opening has a first sloped sidewall and a second sloped sidewall.

13. The electronic package of claim 8, wherein the second interconnect is in an opening in the first mold material, and a center of the second interconnect is offset from a center of the opening.

14. An electronic system, comprising:
a first package substrate having a top side and an opposite bottom side;
a first die coupled to the top side of the first package substrate by interconnects;
underfill material around the interconnects and along an entirety of sidewalls of the first die;
a first mold layer over the first package substrate and surrounding the underfill material and the first die;
a through mold interconnect through the first mold layer and laterally adjacent to the first die, the through mold interconnect comprising a first conductive portion on the top surface of the first package substrate, and a second conductive portion on the first conductive portion, the second conductive portion distinct from the first conductive portion, wherein the first conductive portion has a maximum lateral width greater than a maximum lateral width of the second conductive portion;
a second mold layer in contact with the first mold layer and a top surface of the first die, the second mold layer having a planar bottom surface along the top surface of the first die;

a second package substrate above the first die, the second mold layer and the first mold layer, the second package substrate having a top side and an opposite bottom side;
a second die above and coupled to the top side of the second package substrate by a first wire bond;
a third die over the second die, the third die laterally offset from the second die, and the third die coupled to the top side of the second package substrate by a second wire bond, wherein the first die extends laterally beyond a sidewall of the third die; and
a third mold layer over the second die and the third die and over the second package substrate.

15. The electronic system of claim 14, wherein the first conductive portion of the through mold interconnect is a solder ball.

16. The electronic system of claim 14, wherein the second conductive portion of the through mold interconnect is a solder ball.

17. The electronic system of claim 14, wherein the first conductive portion of the through mold interconnect is a first solder ball, and wherein the second conductive portion of the through mold interconnect is a second solder ball.

18. The electronic package of claim 14, wherein the through mold interconnect is in a through mold opening, and wherein the through mold opening has a first sloped sidewall and a second sloped sidewall from a cross-sectional perspective.

19. The electronic package of claim 18, wherein a center of the through mold interconnect is offset from a center of the through mold opening.

20. The electronic package of claim 14, wherein the through mold interconnect is in a through mold opening, and a center of the through mold interconnect is offset from a center of the through mold opening.

* * * * *